(12) United States Patent
Williams et al.

(10) Patent No.: US 7,888,427 B2
(45) Date of Patent: Feb. 15, 2011

(54) LATENT DOPING OF CONDUCTING POLYMERS

(75) Inventors: Shawn P. Williams, Pittsburgh, PA (US); Darin W. Laird, Pittsburgh, PA (US); Caton C. Goodman, Cheswick, PA (US); Christopher M. Greco, Pittsburgh, PA (US); Jaideep Rajput, Schaumburg, IL (US)

(73) Assignee: Plextronics, Inc., Pittsburgh, PA (US)

( * ) Notice: Subject to any disclaimer, the term of this patent is extended or adjusted under 35 U.S.C. 154(b) by 1 day.

(21) Appl. No.: 11/496,024

(22) Filed: Jul. 31, 2006

(65) Prior Publication Data

US 2007/0065590 A1 Mar. 22, 2007

Related U.S. Application Data

(60) Provisional application No. 60/703,890, filed on Aug. 1, 2005.

(51) Int. Cl.
*C08G 75/02* (2006.01)
*C08L 81/02* (2006.01)
*C08F 28/06* (2006.01)
*C08F 34/04* (2006.01)
*C08F 128/06* (2006.01)
*C08F 134/04* (2006.01)
*C07D 333/06* (2006.01)

(52) U.S. Cl. .......... 524/609; 528/377; 528/380; 525/535; 525/417; 526/256; 549/29

(58) Field of Classification Search .......... 524/609; 528/373, 380, 73, 377; 549/29; 525/535, 525/417; 526/256

See application file for complete search history.

(56) References Cited

U.S. PATENT DOCUMENTS 4,499,008 A * 2/1985 Wellinghoff et al. ........ 252/500

(Continued)

FOREIGN PATENT DOCUMENTS

WO WO 90/13148 11/1990

(Continued)

OTHER PUBLICATIONS

Tolbert et al. Synthetic Metals 1999, 101, 500-501. Elsevier Science S.A.*

(Continued)

*Primary Examiner*—Mark Eashoo
*Assistant Examiner*—Michael Pepitone
(74) *Attorney, Agent, or Firm*—Foley & Lardner LLP

(57) ABSTRACT

Latent doping is provided wherein a conducting polymer is mixed with a dopant in solution without the doping reaction occurring unless solvent is removed. Regioregular polythiophenes are a particularly important embodiment. A composition comprising (i) at least one polymer comprising conjugation in the polymer backbone, (ii) at least one dopant for the polymer, (iii) at least one solvent for the polymer and latent dopant, wherein the polymer, the latent dopant, and the solvent are formulated so that the latent dopant does not substantially dope the polymer when formulated, but does substantially react with the polymer when the solvent is removed. Formulation of the composition can comprise adjusting the order of mixing, the amounts of the components, and the temperature. Methods of formulating the compositions and methods of using the compositions are also provided. OLED, PLED, photovoltaic, and other organic electronic devices can be fabricated.

7 Claims, 3 Drawing Sheets

U.S. PATENT DOCUMENTS

| | | | |
|---|---|---|---|
| 4,576,887 A * | 3/1986 | Ehrlich et al. | 430/71 |
| 4,839,322 A | 6/1989 | Yodice | |
| 5,002,700 A | 3/1991 | Otagawa et al. | |
| 5,427,841 A * | 6/1995 | De Leeuw et al. | 428/209 |
| 5,447,824 A * | 9/1995 | Mutsaers et al. | 430/315 |
| 6,166,172 A | 12/2000 | McCullough et al. | |
| 6,528,815 B1 * | 3/2003 | Brown et al. | 257/40 |
| 6,602,974 B1 | 8/2003 | McCullough et al. | |
| 6,621,099 B2 | 9/2003 | Ong et al. | |
| 6,770,904 B2 | 8/2004 | Ong et al. | |
| 6,777,529 B2 | 8/2004 | Ong et al. | |
| 6,828,685 B2 | 12/2004 | Stasiak | |
| 6,861,799 B1 * | 3/2005 | Friend et al. | 313/504 |
| 6,872,801 B2 | 3/2005 | Ong et al. | |
| 2003/0088032 A1 * | 5/2003 | Luebben et al. | 525/410 |
| 2004/0030091 A1 * | 2/2004 | McCullough et al. | 528/378 |
| 2004/0178408 A1 * | 9/2004 | McCulloch et al. | 257/40 |
| 2004/0220332 A1 * | 11/2004 | Ho et al. | 525/50 |
| 2005/0080219 A1 | 4/2005 | Koller et al. | |
| 2005/0121667 A1 * | 6/2005 | Kuehl et al. | 257/40 |

FOREIGN PATENT DOCUMENTS

| | | |
|---|---|---|
| WO | WO 2004/025746 A2 | 3/2004 |
| WO | WO 2006/036755 A | 4/2006 |

OTHER PUBLICATIONS

Katz et al., Acc. Chem. Research, vol. 34, pp. 359-369 (2001).

McCullough, Adv. Mater., vol. 10, No. 2, pp. 93-116 (1998).

McCullough et al., Chapter 9 in Handbook of Conducting Polymers, $2^{nd}$ Ed. (1998).

*Handbook of Conducting Polymers*, vols. 1&2, T. Skotheim, Ed., Marcel Dekker, Inc., New York (1986).

McCullough et al., J. Org. Chem., vol. 58, pp. 904-912 (1993).

De Leeuw, D. M., "Stable Solutions of Doped Thiophene Oligomers," Synthetic Metals, vol. 57, No. 1, pp. 3597-3602 (1993).

Han, C. C., et al., "Protonic Acids: Generally Applicable Dopants for Conducting Polymers," Synthetic Metal, vol. 30, pp. 123-131 (1989).

Leclerc, M., et al., "Structural Analysis of Poly(3-Alkylthiophene)S," Makromol. Chem., vol. 190, No. 12, pp. 3105-3116 (1989).

Reghu, M., et al., "Metal-Insulator Transition in Polyaniline Doped with Surfactant Counter-ion", Synthetic Metals, vol. 55-57, 5020-5025 (1993).

PCT/US2006/029552, International Search Report dated Jun. 14, 2007 (2 pgs.).

Lebedev, M.Y., et al., "Solvato-Controlled Doping of Conducting Polymers", Chem Mater., vol. 10, pp. 156-163 (1998).

* cited by examiner

LATENT DOPING OF CONDUCTING POLYMERS

RELATED APPLICATIONS

This application claims priority to U.S. provisional application Ser. No. 60/703,890 to Williams et al. filed Aug. 1, 2005 and incorporated herein by reference in its entirety.

BACKGROUND

An important segment of advanced materials and nanotechnology is conjugated polymers, or conducting polymers. Conducting polymers are important for their electronic and optical properties, and one particularly important material property is electronic conductivity. This electronic conductivity can be controlled by doping, wherein charge sites, whether positive or negative, are introduced onto the polymer chain which typically increases conductivity. It is important to be able to control the doping process. For example, it would be useful to be able to adopt conditions wherein the doping reaction is known to occur, and adopt other conditions wherein the doping reaction does not occur. For example, it would be useful to transport and store compositions for later use which are substantially unreactive to doping until a doping reaction is desired to increase conductivity. Also, the doping reaction can create ion pairs which alter the polarity and solvability of the conductive polymer. Hence, a doped polymer can be insoluble in many solvents due to the ionic character and other factors. This insolubility can result in limited processability in the doped state and limit commercialization.

Regioregular polythiophenes, both homopolymers and various kinds of copolymers and terpolymers, are a particularly important example of conducting polymers. See, for example, Katz et al., *Acc. Chem. Research*, 2001, 34, 359-369; McCullough, *Adv. Mater.*, 1998, 10, No. 2, 93-116; McCullough et al., chapter 9 in *Handbook of Conducting Polymers*, $2^{nd}$ Ed., 1998. Controlled doping of regioregular polythiophenes would further enable their commercialization. More refined formulation strategies are needed which can be tailored to particular applications.

SUMMARY

Compositions and processes related to latent doping are described with particular importance being attributed to regioregular polythiophenes. Provided, for example, is a latent doping composition comprising: (i) at least one polymer comprising conjugation in the polymer backbone, (ii) at least one dopant for the polymer, (iii) at least one solvent for the polymer and dopant, wherein the polymer, the dopant, and the solvent are formulated so that the dopant does not substantially dope the polymer when formulated, but does substantially react with the polymer when the solvent is removed. The dopant, therefore, can be a latent dopant as it does not immediately react upon mixing with the polymer and solvent. In an important embodiment, polymer comprises polythiophene, including regioregular polythiophene. More specifically, the polymer can comprise a regioregular polythiophene homopolymer or a regioregular polythiophene copolymer, and the degree of regioregularity can be at least 90%.

The dopant can be an organic dopant. In addition, the dopant can be an oxidative dopant. The solvent can be an organic solvent. In addition, the solvent can be a polar solvent. The amounts of the components, polymer, dopant, and solvent can be varied for each formulation. However, in one important embodiment, the amount of polymer is from about 0.01 wt. % to about 20 wt. %, the amount of dopant is from about 0.01 wt. % to about 6 wt. %, and the amount of solvent is from about 80 wt. % to about 99.9 wt. %. In another important embodiment, the amount of polymer is from about 0.01 wt. % to about 6 wt. %, the amount of dopant is from about 0.01 wt. % to about 6 wt. %, and the amount of solvent is from about 94 wt. % to about 99.9 wt. %.

In one important embodiment, the dopant does not substantially dope the polymer for at least 10 minutes after formulation and storage at 25° C. In another important embodiment, the dopant does not substantially dope the polymer for 30 days after formulation and storage at 50° C.

In addition, the composition in its solution state can show in the UV-VIS spectrum a large neutral peak in the visible region, and in addition, the large neutral peak in the visible region substantially can disappear upon solvent removal.

In a preferred example, the polymer comprises regioregular polythiophene, the dopant is an organic dopant, the solvent is a polar solvent, and the amount of polymer is from about 0.01 wt. % to about 20 wt. %, the amount of dopant is from about 0.01 wt. % to about 6 wt. %, and the amount of solvent is from about 80 wt. % to about 99.9 wt. %. More particularly, the polymer can comprise regioregular polythiophene, the dopant can be an organic dopant, the solvent can be a polar solvent, and the amount of polymer is from about 0.01 wt. % to about 6 wt. %, the amount of dopant is from about 0.01 wt. % to about 6 wt. %, and the amount of solvent is from about 94 wt. % to about 99.9 wt. %.

Another important embodiment is a composition comprising: (i) at least one polymer comprising conjugation in the polymer backbone, wherein the polymer comprises regioregular polythiophene; (ii) at least one organic dopant for the polymer, (iii) at least one polar solvent for the polymer and dopant, wherein the polymer, the dopant, and the solvent are formulated so that the dopant does not substantially dope the polymer when formulated for at least 10 minutes after formulation and storage at 25° C., but does substantially react with the polymer when the solvent is removed; and the amount of polymer is from about 0.01 wt. % to about 20 wt. %, the amount of dopant is from about 0.01 wt. % to about 6 wt. %, and the amount of solvent is from about 80 wt. % to about 99.9 wt. %. Here, more particularly, the amount of polymer can be from about 0.01 wt. % to about 6 wt. %, the amount of dopant can be from about 0.01 wt. % to about 6 wt. %, and the amount of solvent can be from about 94 wt. % to about 99.9 wt. %.

Also provided is a method of formulating a latent doping composition comprising:

(i) providing at least one polymer comprising conjugation in the polymer backbone, (ii) providing at least one dopant for the polymer, (iii) providing at least one solvent, and (iv) formulating the polymer, the dopant, and the solvent to form the composition so that the dopant does not substantially dope the polymer when the composition is formulated, but does substantially react with the polymer when the solvent is removed.

The method can further comprise the step of removing solvent to form a film.

The polymer, in this method, can comprise regioregular polythiophene, and the amount of polymer can be from about 0.01 wt. % to about 20 wt. %, the amount of dopant can be from about 0.01 wt. % to about 6 wt. %, and the amount of solvent can be from about 80 wt. % to about 99.9 wt. %. More particularly, the polymer, in this method, can comprise regioregular polythiophene, and the amount of polymer can be from about 0.01 wt. % to about 6 wt. %, the amount of dopant can be from about 0.01 wt. % to about 6 wt. %, and the amount of solvent can be from about 94 wt. % to about 99.9 wt. %.

In an important embodiment, the method provides that the polymer comprises regioregular polythiophene, the dopant is an organic dopant, and the solvent is a polar solvent; and the amount of polymer is from about 0.01 wt. % to about 6 wt. %, the amount of dopant is from about 0.01 wt. % to about 6 wt. %, and the amount of solvent is from about 94 wt. % to about 99.9 wt. %.

Also provides are devices using the compositions and methods described herein. OLED and PLED applications are of particular importance.

Advantages of latent doping include better storage characteristics for the conjugated polymer, better stability, and better control over the doping process. In addition, a basic and novel feature is that the dopant does not have to be decomposed to be activated. When doping occurs during and/or after deposition and solvent removal, then the processability and solubility of the polymer can be retained and many commercial applications are better enabled.

DETAILED DESCRIPTION

I. Introduction & Overview

Figure 1:
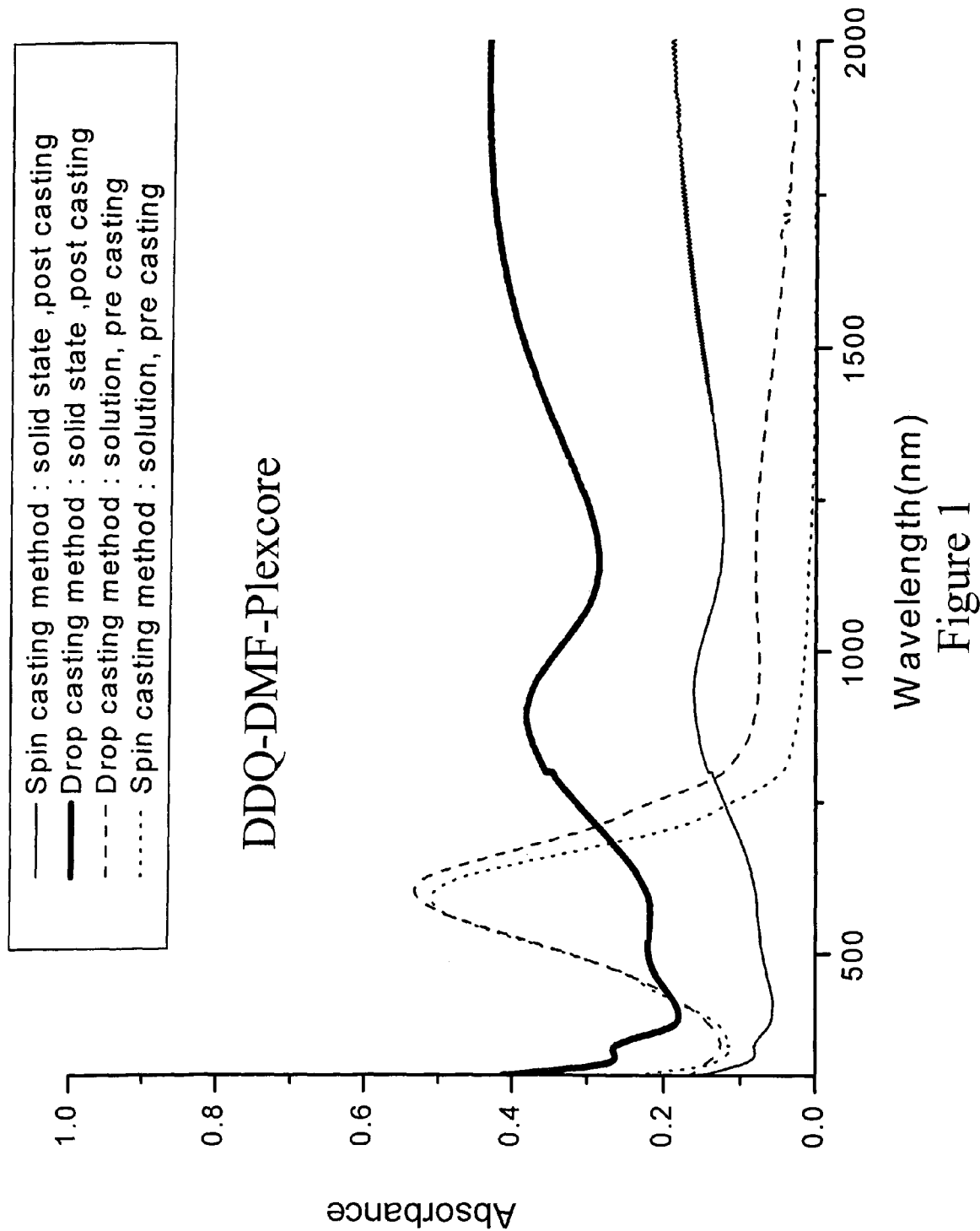
FIG. 1 shows UV-Visible data for a latent doping effect for a DDQ-DMF-Plexcore MP system.

All references cited herein are hereby incorporated by reference.

Priority U.S. provisional application Ser. No. 60/703,890 to Williams et al. filed Aug. 1, 2005 is incorporated herein by reference in its entirety.

Provided is a composition comprising: (i) at least one polymer comprising conjugation in the polymer backbone, (ii) at least one dopant for the polymer, (iii) at least one solvent for the polymer and dopant, wherein the polymer, the dopant, and the solvent are formulated so that the dopant does not substantially dope the polymer when formulated, but does substantially react with the polymer when the solvent is removed.

This effect can be called latent doping. In latent doping, conditions and formulation is selected so that control over the doping reaction is exerted, so that in one stage, substantially no doping reaction occurs, but in another stage, doping reaction occurs. The dopant can be reactive in some conditions, acting as an active species, but not reactive in other conditions. This control can be manifested by suppression of the doping reaction by the solvent, solvent/polymer salvation interaction, solvent dopant interaction, or by some mixture of these effects. As a result, the doping reaction becomes spontaneous when some or all of the solvent is removed. In other words, solvent removal can be engineered to trigger or induce the doping reaction. In addition, in latent doping as described herein, the dopant does not need to be activated by for example initially protecting it and later shining light to decompose it and induce doping with a new active species. In other words, precursors to the dopants do not need to be used so that a chemical reaction is needed to activate the dopant. Rather, solvent removal can be sufficient to induce or trigger doping.

II. Polymer Comprising Conjugation in the Polymer Backbone

The polymer comprising conjugation in the polymer backbone can be one of families of conducting polymers including, for example, unsubstituted or substituted polythiophene, polyaniline, poly(phenylene vinylene), poly(pyrrole), polyphenylene, or polyacetylene. Within a particular family, substituents can be introduced as needed to generate solubility or at least high degrees of dispersability which for purposes herein functionally is not different from solubility. These polymers also can be called intrinsically conductive polymers (ICPs). The polymer can be a homopolymer or have more than one repeat units such as a copolymer or a terpolymer. Random copolymers can be used. Block copolymers or segmented copolymers can be used. Grafting can be done. See for example, *Handbook of Conducting Polymers*, Vols. 1 and 2, T. Skotheim, Ed., Marcel Dekker, Inc., New York, 1986.

Polyanilines of various kinds are described in the literature and are described in, for example, U.S. Pat. No. 5,002,700.

Polypyrroles of various kinds are described in the literature and are described in, for example, U.S. Pat. No. 4,839,322.

Poly(phenylene vinylenes) of various kinds are described in the literature and are described in, for example, WO 90/13148.

The polymers can be substituted with solubilizing groups in an amount which generates solubility. Hydrophobic side groups can be used to promote solubility in less polar solvents, whereas hydrophilic side groups can be used to promote solubility in more polar solvents. Ionic substituents can be used. The polymer should be soluble or at least very well dispersed, so that it functions as if it were truly soluble, in the solvent system so that it is sufficiently stable in solution to allow for film casting or solution processing. It is not believed to be important whether the conducting polymer forms a true solution or a highly dispersed system. The physical and electrical properties can be indistinguishable.

The number average molecular weight of the polymer is not particularly limited but can be, for example, about 1,000 to about 50,000, or about 2,000 to about 25,000, or about 3,000 to about 20,000. The polydispersity is not particularly limited but can be, for example, about 3 or less, or about 2 or less, or about 1.5 or less.

Regioregular polythiophenes are a particularly important embodiment. The amount of regioregularity can be measured by, for example, NMR, and can be at least 90%, at least 95%, or even at least 98% or at least 99%. They can be, for example, substituted at the 3-position, the 4-position, or both. An important example is polymers having heteroatomic substitutions. See, for example, U.S. provisional application No. 60/612,640 to Williams et al. filed Sep. 24, 2004; and U.S. provisional application No. 60/612,641 to Williams et al. filed Sep. 24, 2004. In an important embodiment, the heteroatom is oxygen. The substituent can include multiple heteroatoms including two, three, four, or five heteroatoms for example. An important example includes three oxygen heteroatoms, wherein the oxygens are separated from each other by alkyl/alkylene units such as an ethylene unit. An important example is poly(3-[1,4,7-trioxaoctyl]thiophene) in a regioregular form.

U.S. Pat. No. 6,602,974 describes preparation of block copolymers of regioregular polythiophenes. U.S. Pat. No.

6,166,172 describes an important synthetic method for making regioregular polythiophenes. McCullough et al, J. Org. Chem., 1993, 58, 904-912 describes synthetic methods for making regioregular polythiophenes.

US Patent Publication 2005/0080219, Koller et al, describes synthetic methods and testing for polythiophenes.

Regioregular polythiophenes, both homopolymers and various kinds of copolymers and terpolymers, are a particularly important example of conducting polymers. See, for example, Katz et al., *Acc. Chem. Research,* 2001, 34, 359-369; McCullough, *Adv. Mater.,* 1998, 10, No. 2, 93-116; McCullough et al., chapter 9 in *Handbook of Conducting Polymers,* $2^{nd}$ Ed., 1998. Moreover, polythiophenes are further described in, for example, U.S. Pat. Nos. 6,872,801; 6,777,529; 6,621,099; and 6,770,904 to Ong et al.

U.S. provisional application 60/667,065 to McCullough et al, filed Apr. 1, 2005 describes synthetic methods which can have living characteristics and can be used to prepare the polymer.

U.S. provisional application 60/661,935 to McCullough et al, filed Mar. 16, 2005 describes monocapped conductive polymers having alkenyl or alkynyl end groups which can be used to prepare the polymer.

U.S. provisional application 60/661,934 to Williams et al., filed Mar. 16, 2005, describes copolymers which can be used as the polymer.

The polymer can be a diblock, AB, copolymer, or a triblock, ABA, copolymer. For example, the A block can be a non-conjugated segment, whereas the B block can be a conjugated segment such as a polythiophene or a regioregular polythiophene.

A particularly important example is a regioregular polythiophene comprising side groups comprising heteroatoms in the side group such as oxygen and in particular comprising alkoxy side groups.

III. Dopant

The dopant is not particularly limited, but can be inorganic or organic, and preferably can be organic. Chemical dopants can be used. p-Dopants or n-dopants can be used. The dopant can be an organic oxidant or a reducing agent. It can facilitate electron transfer. It can be charged or uncharged. It can be an organic dye. It can be a charge transfer agent. It can be, for example, a quinone derivative. The dopant can be low molecular weight, for example, less than 500 g/mol, or higher molecular weight, for example, more than 500 g/mol including for example polymeric dopants.

Organic dopants are known in the art. See for example U.S. Pat. Nos. 6,828,685; 5,002,700. Organic dopants include dopants having at least one carbon atom.

The dopant can be a non-aromatic benzene derivative. It can aromatize during a doping reaction to provide a driving force for the process. It can have double ketone structure.

An important example is quinone derivatives. Examples include 2,3-dichloro-5,6-dicyano-1,4-benzoquinone (DDQ), 2,3,5,6-tetrachloro-1,4-benzoquinone) TCQ, 2,3,5,6-tetrafluoro-1,4-benzoquinone (TFQ), 1,4-napthtoquinone (NQ), and 1,4-benzoquinone BQ).

In addition, organic oxidants such as hypervalent iodine oxidants such as iodosylbenzene and iodobenzene diacetate can be used.

The organic dopant can be combined with an acid dopant. Examples include sulfonic acid dopants such as para-toluene sulfonic acid (pTSA) and dodecylbenzene sulfonic acid (DDBSA).

Mixtures of dopants can be used.

IV. Solvent

The solvent is not particularly limited, and solvents for conjugated polymers and dopants are known. One or multiple solvent compounds, or mixtures, can be used. Organic solvents can be used. For example, ethers, esters, and alcohols can be used. Water can be used. Polar solvents can be used. Aprotic solvents can be used. Solvents having molecular weights of under 200, or under 100 g/mol can be used. Oxygen-containing solvents can be used. Nitrogen-containing solvents can be used.

Examples include DMF, dioxolane, methyl ethyl ketone, MIBK, ethylene glycol dimethyl ether, butonitrile, cyclopentanone, cyclohexanone, pyridine, chloroform, nitromethane, 2-nitromethane, trichloroethylene tetrachloroethylene, propylene carbonate, quinoline, cyclohexanone, 1,4-dioxalane, DMSO, nitrobenzene, chlorobenzene, and 1-methyl-2-pyrrolidinone.

V. Formulated so that Latent Dopant does not Substantially Dope

The polymer, dopant, and solvent can be mixed in a variety of orders, concentrations, and temperatures using formulation skills known in the art. The formulated mixtures can be examined for the doping reaction immediately upon mixing and formulation. The doping reaction can be monitored over time.

The formulator can in particular control the amounts of the polymer, dopant, and solvent to achieve the latent doping effect for a particular system.

The amount of polymer is not particularly limited but can be, for example, about 0.01 wt. % to about 20 wt. %, or about 0.01 wt. % to about 6 wt. %, or about 0.1 wt. % to about 3 wt. %.

The amount of dopant is not particularly limited but can be, for example, about 0.01 wt. % to about 6 wt. %, or about 0.1 wt. % to about 3 wt. %.

The amount of solvent is not particularly limited but can be, for example, about 80 wt. % to about 99.9 wt. %, or about 94 wt. % to about 99.9 wt. %, or about 96 wt. % to about 98 wt. %.

The amounts of the polymer and the dopant can be controlled so that there is a molar equivalent between the two, (moles conjugated polymer repeat units: moles dopant), and the molar ratio between the two is about 1:1 to about 50:1, or about 2:1 to about 25:1 or about 2:1 to about 10:1.

In some important embodiments, the latent dopant does not substantially dope the polymer for 10 minutes after formulation and storage at 25° C., for 24 hours after formulation and storage at 25° C., or in addition, the latent dopant does not substantially dope the polymer for 30 days after formulation and storage at 50° C., or after 60 days after formulation and storage at 50° C.

The doping reaction can be monitored by UV-VIS spectroscopy. The solutions can be diluted as needed to do the UV-VIS measurement. One looks for an absence of polaron and bi-polaron peaks and a strong absorbance of the neutral polymer. The composition in its solution state can be observed in the UV-VIS spectrum as a large neutral peak, typically located in the visible region, and in addition, the large neutral peak in the visible region can substantially disappear upon solvent removal.

In some cases, a trace of doping reaction can be detected but substantial doping does not occur. In general, substantial doping occurs when greater than 5% of the neutral peak has disappeared and a concomitant increase of the polaronic and/or bipolaronic peaks are observed.

VI. Dopant does Substantially React Upon Solvent Removal

The solvent removal process is not particularly limited. For example, spin casting or drop casting can be used. Printing or patterning processes such as ink jet printing or role-to-role printing can be used. The parameters for spin casting are not particularly limited. Conditions for homogeneous film formation can be selected including, for example, filtering, and/or inert atmospheric conditions.

Films can be formed with solvent removal. The thickness of the film is not particularly limited. The substrate for the film is not particularly limited.

Solvent can be removed until the amount of solvent is less than about 25 wt. %, then less than about 10 wt. %, then less than about 5 wt. %, and then less than about 1 wt. %, using the known limits for detection of residual solvent in polymers.

UV-VIS-NIR spectroscopy can be used to detect the presence of polarons in the near infra-red region and bi-polaron in the far infra-red region.

The dopant can provide doping for at least 1 percent of the sites available for doping on the conductive polymer, more preferably at least 5 percent, and more preferably at least 25%.

The doped polymer preferably has a conductivity of at least about $10^{-12}$ S/cm, more preferably at least about $10^{-6}$ S/cm, more preferably at least about 1 S/cm, or even further at least 100 S/cm or at least 1,000 S/cm.

VII. Other Embodiments

Additional materials can be added to the solution in addition to the polymer and the latent dopant. For example, at least two polymer can be present including polymers which do not comprise conjugated units. The solutions can be used for blend formation. For example, block copolymers A-B can be blended with polymer A and/or polymer B. If more than one polymer is in a blend, the latent doping process can occur for one, several, or all of the polymers in solution.

In some cases, lower molecular weight oligomers can be used, but generally polymers are used rather than oligomers.

VIII. Applications

Latent doping can provide improved and/or desirable properties such as, for example, electrical conductivities and/or hole transport properties.

The compositions, methods, and polymers described herein can be used in applications and devices, methods of use, which include electroluminescent, photovoltaic, light emitting diodes, non-light emitting diodes, hole injection layers, hole transport layers, electron-transport layers, electron-injection layers, conductive thin films, flexible conductive thin films, thin film transistors, flat panel displays, OLEDs, PLEDs, amplifiers, solar panels, microelectronics, antistatic coatings, cathodes in capacitors, through-hole plating, OFET's, electrochromic devices and sensors.

Hole injection layer applications are described in for example U.S. provisional application 60/651,211 to Sheina et al. filed Feb. 10, 2005

Diode applications are described in U.S. provisional application No. 60/628,202 filed Nov. 17, 2004 to Williams et al.

See also, for example, U.S. provisional application No. 60/612,640 to Williams et al. filed Sep. 24, 2004; and U.S. provisional application No. 60/612,641 to Williams et al. filed Sep. 24, 2004, for photovoltaic and electroluminescent applications.

U.S. Pat. No. 6,602,974 and US Patent Publication 2005/0080219, Koller et al, describes additional uses, devices, and applications.

The various embodiments are further illustrated by the following, non-limiting working examples.

EXAMPLES

Materials. Plexcore MP was prepared at Plextronics, Inc. by the GRIM polymerization method (see U.S. Pat. No. 6,166,172). The polymer was regioregular poly-3-(1,4,7-trioxaoctyl)thiophene (having methoxyethoxyethoxy-substituents). The number average molecular weight was about 15,000, and the PDI was about 1.5. Anhydrous DMF was purchased from Aldrich and used without further purification. It was kept under a blanket of nitrogen during use and storage.

Ink Formulation: To 4 mL N,N-Dimethylformamide (DMF), 8 mg Plexcore MP was added and this solution was sonicated for 30 mins. To this solution, 0.25 molar equivalent of 2,3-Dichloro-5,6-dicyano-1,4-benzoquinone (DDQ) was added to produce an ink. The molar equivalent is with respect to the molar count of repeat units for the polymer. DDQ was used as a doping material for Plexcore MP. 40 µl of this ink was added into a cuvette containing 3 mL DMF. The ink in the cuvette was analyzed via UV-VIS-NIR spectrophotometer (Varian Cary 5000 UV-VIS-IR Spectrophotometer). The UV-VIS-NIR spectrum showed the presence of neutral Plexcore material in the ink. Absence of the polaron and the bi-polaron peaks indicated that the Plexcore MP was undoped when in DMF solution.

Example 1

Drop-Casting

The UV-VIS-NIR spectrum of drop casted ink on a 18 mm×18 mm cover glass was compared to the UV-VIS-NIR spectrum of the ink in solution. Results are shown in FIG. 1. Prior to being drop cast on the cover glass, the ink was filtered through a 0.45 micron PTFE filter to ensure homogeneous film formation. The solvent was allowed to evaporate and the film allowed to dry. The UV-VIS-NIR spectrum of the cover glass indicated the presence of the polaron in the near infra-red region and bi-polaron peak in the far infra-red region. The spectrum clearly indicated the absence of the neutral Plexcore MP in the visible region proving that the Plexcore MP was doped when drop cast with DMF as the solvent and DDQ as the doping material (dopant).

Example 2

Spin Casting

The above ink was spin cast onto a clean 2 inch×2 inch glass substrate. The spinning speed was 300 rpm for 5 seconds followed by 2000 rpm for 60 s. This glass substrate was then analyzed through the UV-VIS-NIR spectrophotometer. Results are provided in FIG. 1. The spectrum of the glass substrate, like the spectrum of the cover glass from the drop-cast example showed the presence of a polaron peak in the infra-red region and the bi-polaron in the far infra red with the absence of neutral Plexcore MP in the visible region. The spectra generated by drop casting and spin casting indicate that the Plexcore MP is doped in the solid state and the spectrum of the ink in the solution form showed that the Plexcore MP is undoped when dissolved in DMF.

Figure 2:
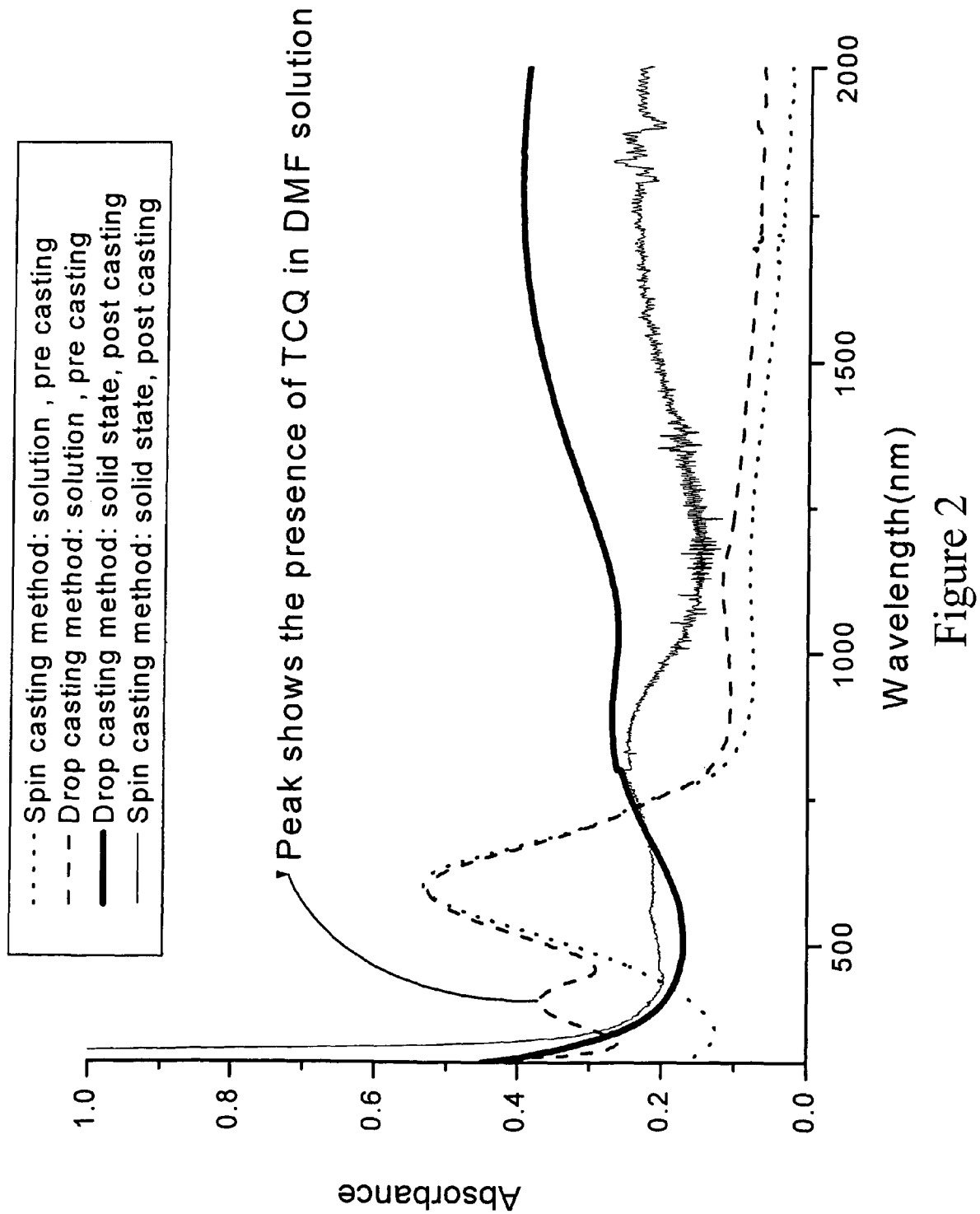
FIG. 2 shows UV-Visible data for a latent doping effect for a TCQ-DMF-Plexcore MP system.
Figure 3:
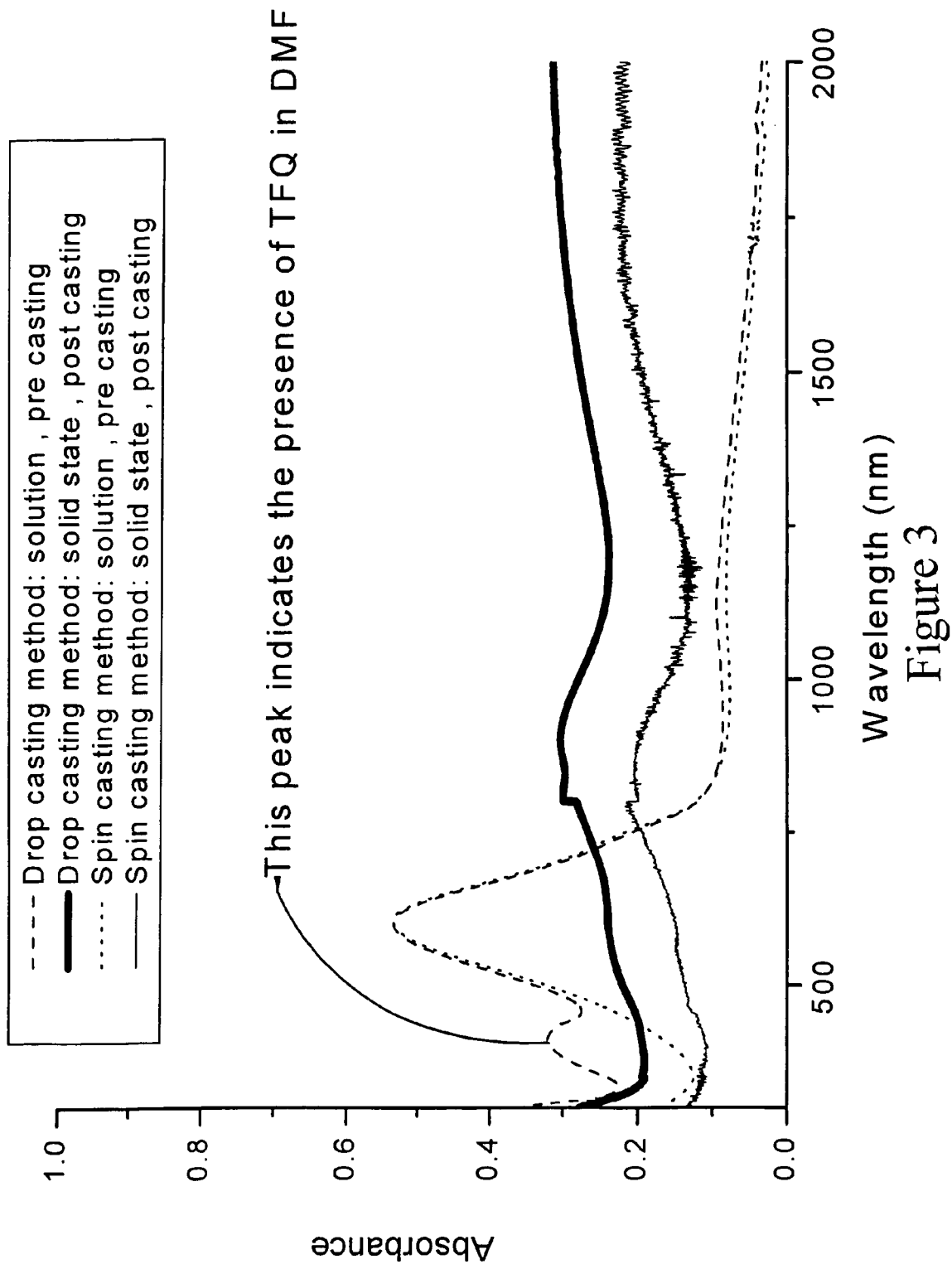
FIG. 3 shows UV-Visible data for a latent doping effect for a TFQ-DMF-Plexcore MP system.

In addition to Examples 1 and 2, similar experiments have been carried out with the inks made from Plexcore MP and DMF and doped with Tetrachloro-p-Benzoquinone (see FIG. 2) and Tetrafluoro-p-Benzoquinone (see FIG. 3). Similar behavior was observed for Plexcore MP remaining undoped in solution form and doped in solid state, showing the latent doping effects.

What is claimed is:

1. A method of formulating a latent doping composition comprising:
    providing at least one polymer comprising conjugation in the polymer backbone,
    providing at least one dopant for the polymer,
    providing at least one solvent,
    formulating the polymer, the dopant, and the solvent to form the composition wherein the composition consists essentially of the polymer, the dopant, and the solvent, and wherein the dopant does not substantially dope the polymer when the composition is formulated, but does substantially react with the polymer when the solvent is removed; wherein the polymer comprises regioregular polythiophene, the dopant is an organic dopant, and the solvent is a polar solvent; wherein the amount of polymer is from about 0.01 wt. % to about 20 wt. %, wherein the amount of dopant is from about 0.01 wt. % to about 6 wt. %, and the amount of solvent is from about 80 wt. % to about 99.9 wt. %, and
    further comprising the step of removing solvent to form a film of doped polymer.

2. The method according to claim 1, wherein the amount of polymer is from about 0.01 wt. % to about 6 wt. %, wherein the amount of dopant is from about 0.01 wt. % to about 6 wt. %, and the amount of solvent is from about 94 wt. % to about 99.9 wt. %.

3. The method according to claim 1, wherein the composition further consists essentially of at least one additional material.

4. The method according to claim 1, wherein the polymer has a number average molecular weight of 2,000 to 25,000.

5. The method according to claim 1, wherein the polymer has a number average molecular weight of 3,000 to 20,000.

6. The method of claim 1, wherein the dopant does not substantially dope the polymer for at least ten minutes after formulation and storage at 25° C.

7. The method of claim 1, wherein the dopant does not substantially dope the polymer for at least thirty days after formulation and storage at 50° C.

* * * * *